United States Patent
Tsunashima

(10) Patent No.: US 12,419,121 B2
(45) Date of Patent: Sep. 16, 2025

(54) DETECTION DEVICE

(71) Applicant: Magnolia White Corporation, Tokyo (JP)

(72) Inventor: Takanori Tsunashima, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 646 days.

(21) Appl. No.: 17/747,496

(22) Filed: May 18, 2022

(65) Prior Publication Data

US 2022/0375973 A1    Nov. 24, 2022

(30) Foreign Application Priority Data

May 24, 2021    (JP) ................. 2021-087075

(51) Int. Cl.
*H10F 39/00*    (2025.01)
*H10F 39/12*    (2025.01)
*H10F 39/18*    (2025.01)

(52) U.S. Cl.
CPC ......... *H10F 39/803* (2025.01); *H10F 39/014* (2025.01); *H10F 39/18* (2025.01); *H10F 39/199* (2025.01)

(58) Field of Classification Search
CPC ...... H10F 39/803; H10F 39/199; H10F 39/18; H10F 39/014
See application file for complete search history.

(56) References Cited

U.S. PATENT DOCUMENTS

| | | | |
|---|---|---|---|
| 4,628,364 A | 12/1986 | Koch | |
| 6,842,192 B1 | 1/2005 | Suzuki et al. | |
| 8,424,764 B2 | 4/2013 | Tanaka et al. | |
| 2009/0244352 A1* | 10/2009 | Harada | A61B 6/4494 348/E5.022 |

(Continued)

FOREIGN PATENT DOCUMENTS

| | | |
|---|---|---|
| JP | S59-083475 A | 5/1984 |
| JP | H7-007673 A | 1/1995 |
| JP | H11-103420 A | 4/1999 |

(Continued)

OTHER PUBLICATIONS

Office Action issued in related Japanese Patent Application No. 2021-087075 on Sep. 3, 2024 and English translation of same. 6 pages.

*Primary Examiner* — Robert J Michaud
(74) *Attorney, Agent, or Firm* — K&L Gates LLP

(57) ABSTRACT

A detection device includes a plurality of detection elements arranged in a matrix having a row-column configuration in a detection region, a plurality of scan lines coupled to the detection elements arranged in a first direction, a plurality of output signal lines that are coupled to the detection elements arranged in a second direction different from the first direction, and to which the detection elements output detection signals, a detection circuit configured to be supplied with the detection signals through the output signal lines, and a control circuit configured to output at least selection signals for switching between selection and non-selection of the output signal lines to supply the detection signals to the detection circuit. The control circuit is configured to discharge an electric charge of each of the non-selected output signal lines different from the selected output signal lines.

6 Claims, 14 Drawing Sheets

(56) References Cited

U.S. PATENT DOCUMENTS

2011/0147596 A1\* 6/2011 Ishida ................... H04N 25/76
250/366

FOREIGN PATENT DOCUMENTS

| JP | H11-266400 A | 9/1999 |
| JP | 2011-010054 A | 1/2011 |
| JP | 2018-014594 A | 1/2018 |

\* cited by examiner

DETECTION DEVICE

CROSS-REFERENCE TO RELATED APPLICATION

This application claims the benefit of priority from Japanese Patent Application No. 2021-087075 filed on May 24, 2021, the entire contents of which are incorporated herein by reference.

BACKGROUND

1. Technical Field

The present disclosure relates to a detection device.

2. Description of the Related Art

For example, photoelectric conversion devices are known that use a positive-intrinsic-negative (PIN) photodiode as a photoelectric conversion element for detection (refer, for example, to Japanese Patent Application Laid-open Publication No. 2018-014594 (JP-A-2018-014594)). Such a photoelectric conversion device is provided, for each pixel, with a source follower circuit that includes a field-effect transistor for receiving, at the gate thereof, a signal charge generated by a photoelectric converter, and that causes the field-effect transistor to read out a signal voltage corresponding to the signal charge to a signal line. The photoelectric conversion device transfers an electric charge based on input information photoelectrically converted by the photoelectric converter to an external capacitor, and the external capacitor converts the electric charge into a signal voltage.

For example, image reading devices (detection devices) are known that use a double-gate thin-film transistor (TFT) as an imaging element, segment discharge state, precharge state, natural discharge state, and reading voltage state in each gate period (scan line selection period), and acquire data line (signal line) potential (refer, for example, to JP-A-2018-014594). JP-A-2018-014594 discloses a technique for achieving high-speed data acquisition by reducing the time required to reach a saturation voltage.

In recent years, as the detection devices have become larger in size and higher in detection resolution, the wiring load may increase and the detection accuracy of detected signals may decrease.

It is an object of the present disclosure to provide a detection device capable of improving the detection accuracy.

SUMMARY

A detection device according to an embodiment of the present disclosure includes a plurality of detection elements arranged in a matrix having a row-column configuration in a detection region, a plurality of scan lines coupled to the detection elements arranged in a first direction, a plurality of output signal lines that are coupled to the detection elements arranged in a second direction different from the first direction, and to which the detection elements output detection signals, a detection circuit configured to be supplied with the detection signals through the output signal lines, and a control circuit configured to output at least selection signals for switching between selection and non-selection of the output signal lines to supply the detection signals to the detection circuit. The control circuit is configured to discharge an electric charge of each of the non-selected output signal lines different from the selected output signal lines.

A detection device according to an embodiment of the present disclosure includes detection elements arranged in a detection region, a switch coupled to each of the detection elements, a scan line that is coupled to the switch, and is configured to control opening and closing of the switch, an output signal line coupled to the switch, and a detection circuit configured to be supplied with a detection signal from each of the detection elements through the output signal line. A predetermined potential is applied to the output signal line when the detection element is electrically coupled to the output signal line through the switch, except during a period in which the detection circuit reads the detection signal.

DETAILED DESCRIPTION

Figure 1A:
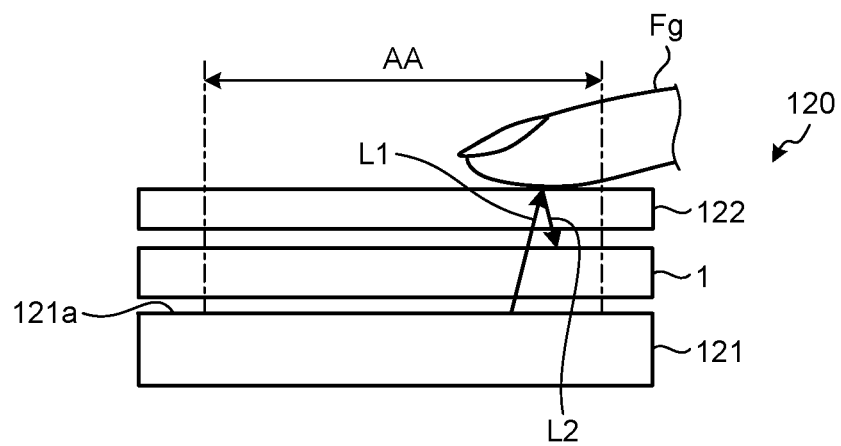
FIG. 1A is a sectional view illustrating a schematic sectional configuration of a detection apparatus having an illumination device, the detection apparatus including a detection device according to embodiments of the present disclosure.

The following describes modes (embodiments) for carrying out the present disclosure in detail with reference to the drawings. The present disclosure is not limited to the description of the embodiments given below. Components described below include those easily conceivable by those skilled in the art or those substantially identical thereto. In addition, the components described below can be combined as appropriate. What is disclosed herein is merely an example, and the present disclosure naturally encompasses appropriate modifications easily conceivable by those skilled in the art while maintaining the gist of the disclosure. To further clarify the description, the drawings may schematically illustrate, for example, widths, thicknesses, and shapes of various parts as compared with actual aspects thereof. However, they are merely examples, and interpretation of the present disclosure is not limited thereto. The same component as that described with reference to an already mentioned drawing is denoted by the same reference numeral through the description and the drawings, and detailed description thereof may not be repeated where appropriate.

In the present specification and claims, in expressing an aspect of disposing another structure above a certain structure, a case of simply expressing "above" includes both a case of disposing the other structure immediately above the certain structure so as to contact the certain structure and a case of disposing the other structure above the certain structure with still another structure interposed therebetween, unless otherwise specified.

FIG. 1 is a sectional view illustrating a schematic sectional configuration of a detection apparatus having an illumination device, the detection apparatus including a detection device according to the embodiments. As illustrated in FIG. 1, a detection apparatus 120 having an illumination device includes a detection device 1, an illumination device 121, and a cover glass 122. The illumination device 121, the detection device 1, and the cover glass 122 are stacked in this order in a direction orthogonal to a surface of the detection device 1.

The illumination device 121 has a light-emitting surface 121a for emitting light, and emits light L1 from the light-emitting surface 121a toward the detection device 1. The illumination device 121 is a backlight. The illumination device 121 may be, for example, what is called a side light-type backlight that includes a light guide plate provided in a position corresponding to a detection region AA and a plurality of light sources arranged at one end or both ends of the light guide plate. For example, light-emitting diodes (LEDs) for emitting light in a predetermined color are used as the light sources. The illumination device 121 may be what is called a direct-type backlight that includes the light sources (such as the LEDs) provided directly below the detection region AA. The illumination device 121 is not limited to the backlight, and may be provided on a lateral side or an upper side of the detection device 1, and may emit the light L1 from the lateral side or the upper side of a finger Fg.

The detection device 1 is provided so as to face the light-emitting surface 121a of the illumination device 121. The light L1 emitted from the illumination device 121 passes through the detection device 1 and the cover glass 122. The detection device 1 can detect a detection target (for example, asperities (such as a fingerprint) on a surface of the finger Fg in the example illustrated in FIG. 1) by detecting light L2 reflected on an interface between the cover glass 122 and air. The color of the light L1 from the illumination device 121 may be varied according to the detection target.

The cover glass 122 is a member for protecting the detection device 1 and the illumination device 121, and covers the detection device 1 and the illumination device 121. The cover glass 122 is, for example, a glass substrate. The cover glass 122 is not limited to a glass substrate, and may be, for example, a resin substrate. The cover glass 122 need not be provided. In this case, the surface of the detection device 1 is provided with a protective layer, and the detection target (in this example, the finger Fg) contacts the protective layer of the detection device 1.

The detection apparatus 120 having an illumination device may be provided with a display panel instead of the illumination device 121. The display panel may be, for example, an organic electroluminescent (EL) diode (organic light-emitting diode (OLED)) panel or an inorganic EL display (micro-LED or mini-LED) panel. Alternatively, the display panel may be a liquid crystal display (LCD) panel using liquid crystal elements as display elements or an electrophoretic display (EPD) panel using electrophoretic elements as display elements.

Figure 1B:
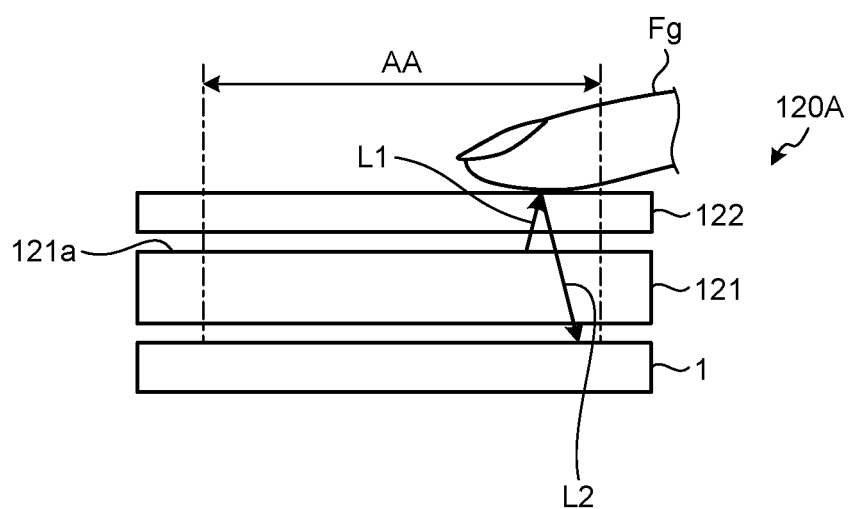
FIG. 1B is a sectional view illustrating a schematic sectional configuration of a detection apparatus having an illumination device according to a modification of the embodiments.

FIG. 1B is a sectional view illustrating a schematic sectional configuration of a detection apparatus having an illumination device according to a modification of the embodiments. As illustrated in FIG. 1B, in a detection apparatus 120A having an illumination device, the detection device 1, the illumination device 121, and the cover glass 122 are stacked in this order in the direction orthogonal to the surface of the detection device 1. Also, in the present modification, a display panel such as an organic EL display panel can be employed as the illumination device 121.

The light L1 emitted from the illumination device 121 passes through the cover glass 122, and then, is reflected by the finger Fg. The light L2 reflected by the finger Fg passes through the cover glass 122, and further passes through the illumination device 121. The detection device 1 can perform detection of information on a living body such as the fingerprint detection by receiving the light L2 that has passed through the illumination device 121.

Figure 2:
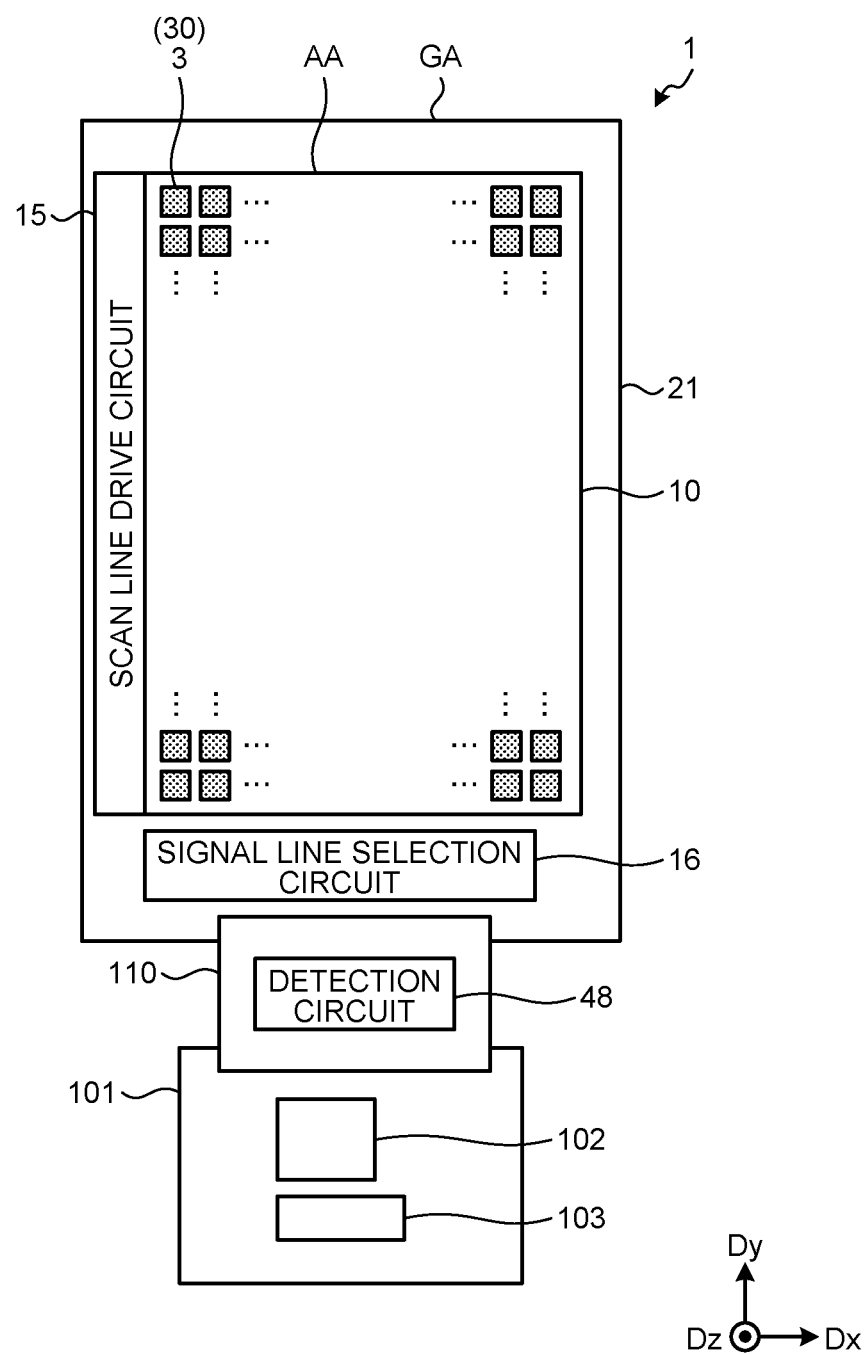
FIG. 2 is a plan view illustrating the detection device according to the embodiments.

FIG. 2 is a plan view illustrating the detection device according to the embodiments. As illustrated in FIG. 2, the detection device 1 includes a substrate 21, a sensor area 10, a scan line drive circuit 15, a signal line selection circuit 16, a detection circuit 48, a control circuit 102, and a power supply circuit 103.

The substrate 21 is electrically coupled to a control substrate 101 through a wiring substrate 110. The wiring substrate 110 is, for example, a flexible printed circuit board or a rigid circuit board. The wiring substrate 110 is provided with the detection circuit 48. The control substrate 101 is provided with the control circuit 102 and the power supply circuit 103. The control circuit 102 is, for example, a field-programmable gate array (FPGA). The control circuit 102 supplies control signals to the sensor area 10, the scan line drive circuit 15, and the signal line selection circuit 16 to control detection operation of the sensor area 10. The power supply circuit 103 supplies voltage signals including, for example, a power supply potential Vsf, a reset potential Vrst, and a reference potential VCOM (refer to FIG. 4) to the sensor area 10, the scan line drive circuit 15, and the signal line selection circuit 16.

The substrate 21 has the detection region AA and a peripheral region GA. The detection region AA is a region overlapping a plurality of detection elements 3 included in the sensor area 10. The peripheral region GA is a region outside the detection region AA, and is a region not overlapping the detection elements 3. That is, the peripheral region GA is a region between the outer perimeter of the detection region AA and the ends of the substrate 21. The scan line drive circuit 15 and the signal line selection circuit 16 are provided in the peripheral region GA.

Each of the detection elements 3 of the sensor area 10 is a photosensor including a photoelectric conversion element 30. The photoelectric conversion element 30 is a photodiode, and is a photodetector that outputs an electrical signal corresponding to light irradiating each of the photoelectric conversion elements 30. More specifically, the photoelectric conversion element 30 is a positive-intrinsic-negative (PIN) photodiode. The detection elements 3 are arranged in a matrix having a row-column configuration in the detection region AA. The photoelectric conversion element 30 included in each of the detection elements 3 performs the detection according to a gate drive signal (for example, a reset control signal RST or a read control signal RD) supplied from the scan line drive circuit 15. Each of the photoelectric conversion elements 30 outputs the electrical signal corresponding to the light irradiating the photoelectric conversion element 30 as a detection signal Vdet to the signal line selection circuit 16. The detection device 1 detects the information on the living body based on the detection signals Vdet received from the photoelectric conversion elements 30.

The scan line drive circuit 15 and the signal line selection circuit 16 are provided in the peripheral region GA. Specifically, the scan line drive circuit 15 is provided in a region extending along a second direction Dy in the peripheral region GA. The signal line selection circuit 16 is provided in a region extending along a first direction Dx in the peripheral region GA, and is provided between the sensor area 10 and the detection circuit 48.

The first direction Dx is one direction in a plane parallel to the substrate 21. The second direction Dy is one direction in the plane parallel to the substrate 21, and is a direction orthogonal to the first direction Dx. The second direction Dy may non-orthogonally intersect the first direction Dx. A third direction Dz is a direction orthogonal to the first direction Dx and the second direction Dy, and is a direction normal to the substrate 21.

Figure 3:
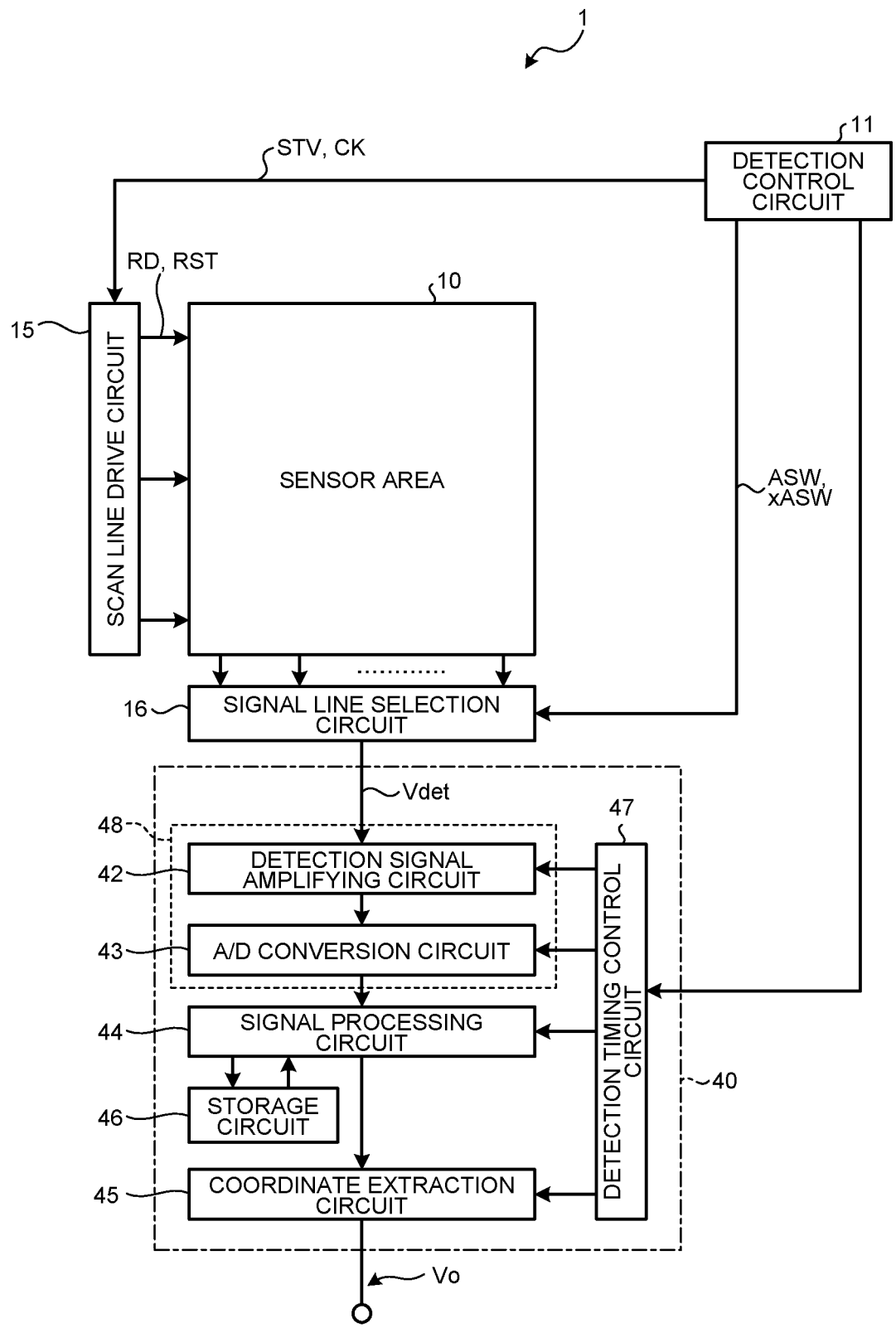
FIG. 3 is a block diagram illustrating a configuration example of the detection device according to the embodiments.

FIG. 3 is a block diagram illustrating a configuration example of the detection device according to the embodiments. As illustrated in FIG. 3, the detection device 1 further includes a detection control circuit 11 and a detector (detection processing circuit) 40. One, some, or all functions of the detection control circuit 11 may be included in the control circuit 102. One, some, or all functions of the detector 40 other than those of the detection circuit 48 may also be included in the control circuit 102.

The detection control circuit 11 is a circuit that supplies respective control signals to the scan line drive circuit 15, the signal line selection circuit 16, and the detector 40 to control operations thereof. The detection control circuit 11 supplies various control signals including, for example, a start signal STV and a clock signal CK to the scan line drive circuit 15. The detection control circuit 11 also supplies various control signals including, for example, a first selection signal ASW and a second selection signal xASW to the signal line selection circuit 16.

The scan line drive circuit 15 is a circuit that drives a plurality of gate lines (read control scan lines GLrd and reset control scan lines GLrst (refer to FIG. 4)) based on the various control signals. The scan line drive circuit 15 sequentially or simultaneously selects the gate lines, and supplies the gate drive signals (for example, the reset control signals RST or the read control signals RD) to the selected gate lines. Through this operation, the scan line drive circuit 15 selects the photoelectric conversion elements 30 coupled to the gate lines.

Figure 4:
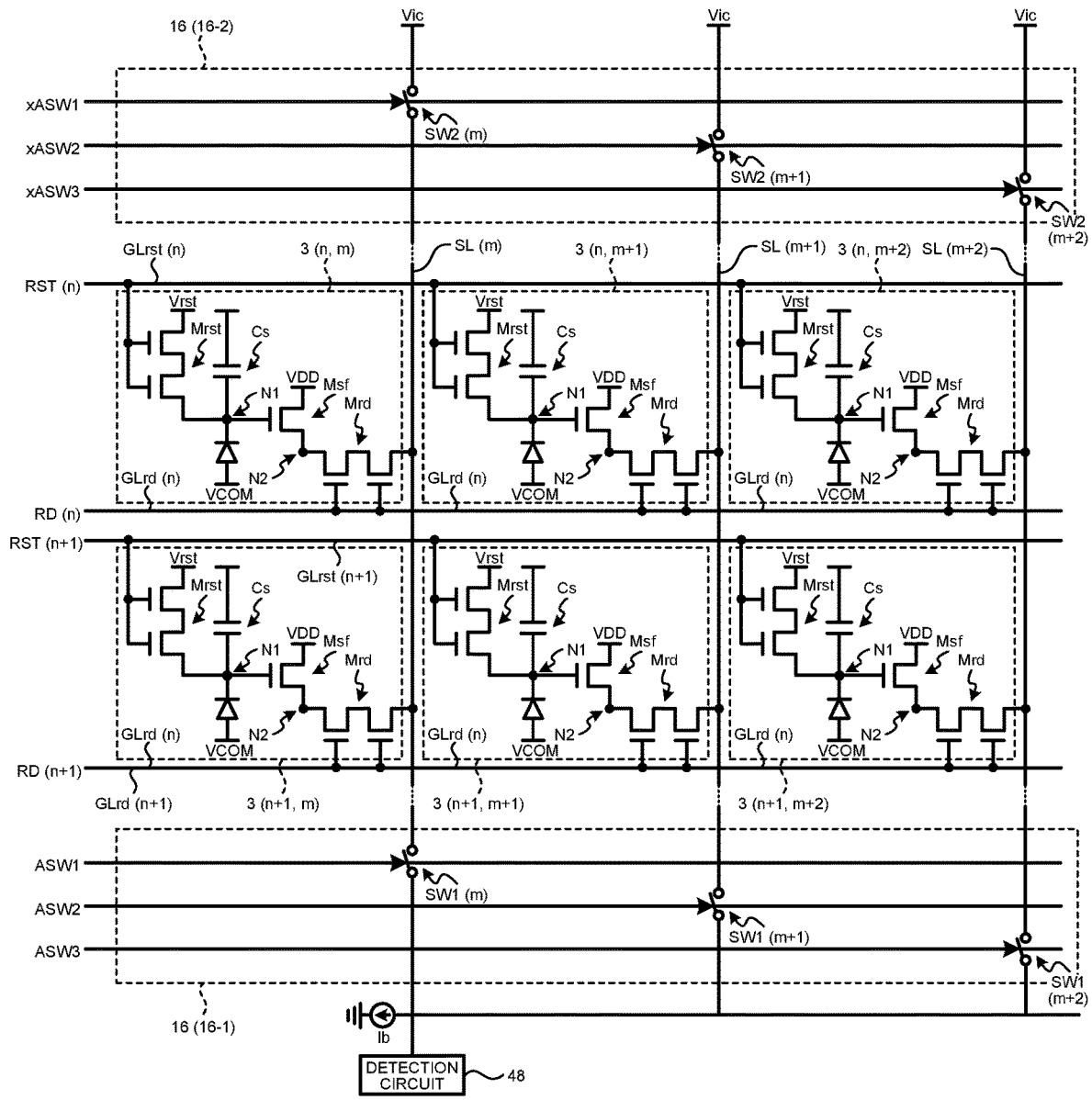
FIG. 4 is a circuit diagram illustrating an exemplary circuit configuration of the detection device according to a first embodiment of the present disclosure.

The signal line selection circuit 16 is a switching circuit that sequentially or simultaneously selects a plurality of output signal lines SL (refer to FIG. 4). The signal line selection circuit 16 is, for example, a multiplexer. The signal line selection circuit 16 couples the selected output signal lines SL to the detection circuit 48 based on the first selection signal ASW supplied from the detection control circuit 11. Through this operation, the signal line selection circuit 16 outputs the detection signal Vdet of the photoelectric conversion element 30 to the detector 40. In the embodiments, the signal line selection circuit 16 supplies an output line reference potential Vic to the output signal lines SL that are not selected as the output signal lines SL to supply the detection signals Vdet to the detection circuit 48 based on the second selection signal xASW supplied from the detection control circuit 11. The output signal line SL that is selected based on the second selection signal xASW and the output signal line SL that was selected based on the first selection signal ASW are different. In an aspect of the present disclosure, the signal line selection circuit 16 may be included in the detector 40.

The detector 40 includes the detection circuit 48, a signal processing circuit 44, a coordinate extraction circuit 45, a storage circuit 46, and a detection timing control circuit 47. The detection timing control circuit 47 performs control to cause the detection circuit 48, the signal processing circuit 44, and the coordinate extraction circuit 45 to operate in synchronization with one another based on a control signal supplied from the detection control circuit 11.

The detection circuit 48 is, for example, an analog front-end (AFE) circuit. The detection circuit 48 is a signal processing circuit having functions of at least a detection signal amplifying circuit 42 and an analog-to-digital (A/D) conversion circuit 43. The detection signal amplifying circuit 42 amplifies the detection signal Vdet. The A/D conversion circuit 43 converts an analog signal output from the detection signal amplifying circuit 42 into a digital signal.

The signal processing circuit 44 is a logic circuit that detects a predetermined physical quantity received by the sensor area 10 based on output signals of the detection circuit 48. The signal processing circuit 44 can detect asperities on the surface of the finger Fg or a palm based on the signals from the detection circuit 48 when the finger Fg is in contact with or in proximity to a detection surface. The signal processing circuit 44 may detect the information on the living body based on the signals from the detection circuit 48. Examples of the information on the living body include a blood vessel image, a pulse wave, pulsation, and a blood oxygen saturation level of the finger Fg or the palm.

The storage circuit 46 temporarily stores therein signals calculated by the signal processing circuit 44. The storage circuit 46 may be, for example, a random-access memory (RAM) or a register circuit.

The coordinate extraction circuit 45 is a logic circuit that obtains detected coordinates of the asperities on the surface of the finger Fg or the like when the contact or proximity of the finger Fg is detected by the signal processing circuit 44. The coordinate extraction circuit 45 is the logic circuit that also obtains detected coordinates of blood vessels of the finger Fg or the palm. The coordinate extraction circuit 45 combines the detection signals Vdet output from the respective detection elements 3 of the sensor unit 10 to generate two-dimensional information representing a shape of the asperities on the surface of the finger Fg or the like. The coordinate extraction circuit 45 may output the detection signals Vdet as sensor outputs Vo instead of calculating the detected coordinates.

First Embodiment

The following describes a circuit configuration example and an operation example of the detection device 1 according to a first embodiment of the present disclosure. FIG. 4 is a circuit diagram illustrating an exemplary circuit configuration of the detection device according to the first embodiment. FIG. 4 illustrates the detection elements 3. As illustrated in FIG. 4, each of the detection elements 3 includes the photoelectric conversion element 30, a reset transistor Mrst, a read transistor Mrd, and a source follower transistor Msf. The detection elements 3 are provided with the reset control scan lines GLrst and the read control scan lines GLrd as detection drive lines (scan lines), and provided with the output signal lines SL as wiring for reading signals.

The output signal lines SL are coupled to a current source circuit for conducting a bias current Ib to the read transistor Mrd and the source follower transistor Msf. In the present embodiment, the read transistor Mrd and the source follower transistor are metal-oxide semiconductor (MOS) transistors. When the Msf source follower transistor is an n-type MOS transistor, the bias current Ib flows out from the source of the source follower transistor to each of the output signal lines SL. When the source follower transistor is a p-type MOS transistor, the bias current Ib flows from the output signal line SL into the source of the source follower transistor. This configuration enables detection of the detection signal Vdet output to the output signal line SL by the detection element 3. This current source circuit may be provided in the detection circuit 48 or in the substrate 21.

In FIG. 4, the detection element 3 in the nth row and the mth column is referred to as the detection element 3(n, m). Specifically, the detection element 3 in the nth row and the mth column is referred to as the detection element 3(n, m); the detection element 3 in the nth row and the (m+1)th column is referred to as the detection element 3(n, m+1); and the detection element 3 in the nth row and the (m+2)th column is referred to as the detection element 3(n, m+2). The detection element 3 in the (n+1)th row and the mth column is referred to as the detection element 3(n+1, m); the detection element 3 in the (n+1)th row and the (m+1)th column is referred to as the detection element 3(n+1, m+1); and the detection element 3 in the (n+1)th row and the (m+2)th column is referred to as the detection element 3(n+1, m+2). Hereinafter each of the detection element 3(n, m), the detection element 3(n, m+1), the detection element 3(n, m+2), the detection element 3(n+1, m), the detection element 3(n+1, m+1), and the detection element 3(n+1, m+2) will be referred to as the detection element 3 in the description common thereto.

In FIG. 4, one of the reset control scan lines GLrst coupled to the detection elements 3(n, m), 3(n, m+1), and 3(n, m+2) arranged in the first direction Dx in the nth row is referred to as a reset control scan line GLrst(n), and another of the reset control scan lines GLrst coupled to the detection elements 3(n+1, m), 3(n+1, m+1), and 3(n+1, m+2) arranged in the first direction Dx in the (n+1)th row is referred to as a reset control scan line GLrst(n+1). Hereinafter each of the reset control scan line GLrst(n) and the reset control scan line GLrst(n+1) will be referred to as a reset control scan line GLrst in the description common thereto.

In FIG. 4, one of the read control scan lines GLrd coupled to the detection elements 3(n, m), 3(n, m+1), and 3(n, m+2) arranged in the first direction Dx in the nth row is referred to as a read control scan line GLrd(n), and another of the read control scan lines GLrd coupled to the detection elements 3(n+1, m), 3(n+1, m+1), and 3(n+1, m+2) arranged in the first direction Dx in the (n+1)th row is referred to as a read control scan line GLrd(n+1). Hereinafter each of the read control scan line GLrd(n) and the read control scan line GLrd(n+1) will be referred to as a reset control scan line GLrst in the description common thereto.

In FIG. 4, the output signal line SL coupled to the detection elements 3(n, m) and 3(n+1, m) arranged in the second direction Dy in the mth column is referred to as the output signal line SL(m); the output signal line SL coupled to the detection elements 3(n, m+1) and 3(n+1, m+1) arranged in the second direction Dy in the (m+1)th column is referred to as the output signal line SL(m+1); and the output signal line SL coupled to the detection elements 3(n, m+2) and 3(n+1, m+2) arranged in the second direction Dy in the (m+2)th column is referred to as the output signal line SL(m+2). Hereinafter each of the output signal line SL(m), the output signal line SL(m+1), and the output signal line SL(m+2) will be referred to as the output signal line SL in the description common thereto.

The reset control scan lines GLrst, the read control scan lines GLrd, and the output signal lines SL are each coupled to the detection elements 3. Specifically, the reset control scan lines GLrst and the read control scan lines GLrd extend in the first direction Dx (refer to FIG. 2), and are each coupled to the detection elements 3 arranged in the first direction Dx. The output signal lines SL extend in the second direction Dy, and are coupled to the detection elements 3 arranged in the second direction Dy.

The reset transistor Mrst, the read transistor Mrd, and the source follower transistor Msf are provided correspondingly to each of the photoelectric conversion elements 30. Each of the transistors included in the detection element 3 is constituted by an n-type thin-film transistor (TFT). However, each of the transistors is not limited thereto, and may be constituted by a p-type TFT.

The reference potential VCOM is applied to the anode of the photoelectric conversion element 30. The cathode of the photoelectric conversion element 30 is coupled to a node N1. The node N1 is coupled to a capacitor Cs, one of the source and the drain of the reset transistor Mrst, and the gate of the source follower transistor Msf. One end of the capacitors Cs is coupled to the node N1, and the other end thereof to the reset potential Vrst. When light irradiates the photoelectric conversion element 30, a signal (potential) output from the photoelectric conversion element 30 is stored in the capacitor Cs. While FIG. 4 illustrates the capacitor Cs as one element, the capacitor Cs actually includes a plurality of capacitors formed between different electrodes. While FIG. 4 illustrates the example in which the reference potential VCOM is applied to the anode of the photoelectric conversion element 30, and the cathode of the photoelectric conversion element 30 is coupled to the node N1, the present disclosure is not limited to this example.

The gates of the reset transistor Mrst are coupled to the reset control scan line GLrst. The other of the source and the drain of the reset transistor Mrst is supplied with the reset potential Vrst. When the reset transistor Mrst is turned on (into a conduction state) in response to the reset control signal RST, the potential of the node N1 is reset to the reset potential Vrst. As a result, the reset potential Vrst is applied to the cathode of the photoelectric conversion element 30. The reference potential VCOM has a potential lower than the reset potential Vrst, and thus, the photoelectric conversion element 30 is driven in a reverse bias state. In an aspect of the present disclosure, the reset potential Vrst may be applied to the anode of the photoelectric conversion element 30, depending on the configuration of the detection element 3.

The source follower transistor Msf is coupled between a terminal supplied with a power supply potential VDD and the read transistor Mrd (node N2). The gate of the source follower transistor Msf is coupled to the node N1. The gate of the source follower transistor Msf is supplied with the signal (potential) generated in the photoelectric conversion element 30. This operation causes the source follower transistor Msf to output a signal (voltage) corresponding to the signal (potential) generated in the photoelectric conversion element 30 to the read transistor Mrd. Specifically, a voltage obtained by adding a gate-to-source voltage (Vth) of the source follower transistor Msf to the signal (potential) generated in the photoelectric conversion element 30 is output to the read transistor Mrd.

The read transistor Mrd is coupled between the source of the source follower transistor Msf (node N2) and the output signal line SL. The gates of the read transistor Mrd are coupled to the read control scan line GLrd. The drain of the read transistor Mrd is coupled to the output signal line SL. Alternatively, in an aspect of the present disclosure, the read transistor Mrd may be coupled between the drain of the source follower transistor Msf (node N2) and the output signal line SL; the gates of the read transistor Mrd may be coupled to the read control scan line GLrd; and the source of the read transistor Mrd may be coupled to the output signal line SL. When the read transistor Mrd is turned on in response to the read control signal RD, the signal output from the source follower transistor Msf is output as the detection signal Vdet to the output signal line SL. Here, the signal output from the source follower transistor Msf is the signal voltage corresponding to the signal (potential) generated in the photoelectric conversion element 30.

In the example illustrated in FIG. 4, the reset transistor Mrst and the read transistor Mrd each have what is called a double-gate structure configured by coupling two transistors in series. However, the reset transistor Mrst and the read transistor Mrd are not limited to this structure, and may each have a single-gate structure, or may each have three or more transistors coupled in series. The circuit of each of the detection elements 3 is not limited to the configuration including the three transistors of the reset transistor Mrst, the source follower transistor Msf, and the read transistor Mrd. The detection element 3 may have two transistors or four or more transistors.

In the present embodiment, the signal line selection circuit 16 includes a first signal line selection circuit 16-1 and a second signal line selection circuit 16-2. The first signal line selection circuit 16-1 includes first switching elements SW1(*m*), SW1(*m*+1), and SW1(*m*+2). The second signal line selection circuit 16-2 includes second switching elements SW2(*m*), SW2(*m*+1), and SW2(*m*+2).

The output signal line SL(m) is coupled to the detection circuit 48 through the first switching element SW1(*m*). The output signal line SL(m+1) is coupled to the detection circuit 48 through the first switching element SW1(*m*+1). The output signal line SL(m+2) is coupled to the detection circuit 48 through the first switching element SW1(*m*+2).

The output signal line SL(m) is supplied with the output line reference potential Vic through the second switching element SW2(*m*). The output signal line SL(m+1) is supplied with the output line reference potential Vic through the second switching element SW2(*m*+1). The output signal line SL(m+2) is supplied with the output line reference potential Vic through the second switching element SW2(*m*+2).

If the source follower transistor Msf is an n-type transistor, the output line reference potential Vic is preferably set within a range from the potential of the node N1 assumed to be reached after a storage period Pch to a voltage lower than the potential by the gate-to-source voltage (Vth) of the source follower transistor Msf. If the source follower transistor Msf is a p-type transistor, the output line reference potential Vic is preferably set within a range from the potential of the node N1 assumed to be reached after the storage period Pch to a voltage higher than the potential by the gate-to-source voltage (Vth) of the source follower transistor Msf.

In the present embodiment, the first switching elements SW1(*m*), SW1(*m*+1), and SW1(*m*+2) and the second switching elements SW2(*m*), SW2(*m*+1), and SW2(*m*+2) are assumed to be switching elements that are turned on when first selection signals ASW1, ASW2, and ASW3 and second selection signals xASW1, xASW2, and xASW3 are HIGH (high-level voltage "H"), and are turned off when the first selection signals ASW1, ASW2, and ASW3 and the second selection signals xASW1, xASW2, and xASW3 are LOW (low-level voltage "L"), but may be switching elements that are turned on when the first selection signals ASW1, ASW2, and ASW3 and the second selection signals xASW1, xASW2, and xASW3 are LOW (low-level voltage "L"), and are turned off when the first selection signals ASW1, ASW2, and ASW3 and the second selection signals xASW1, xASW2, and xASW3 are HIGH (high-level voltage "H").

Figure 5:
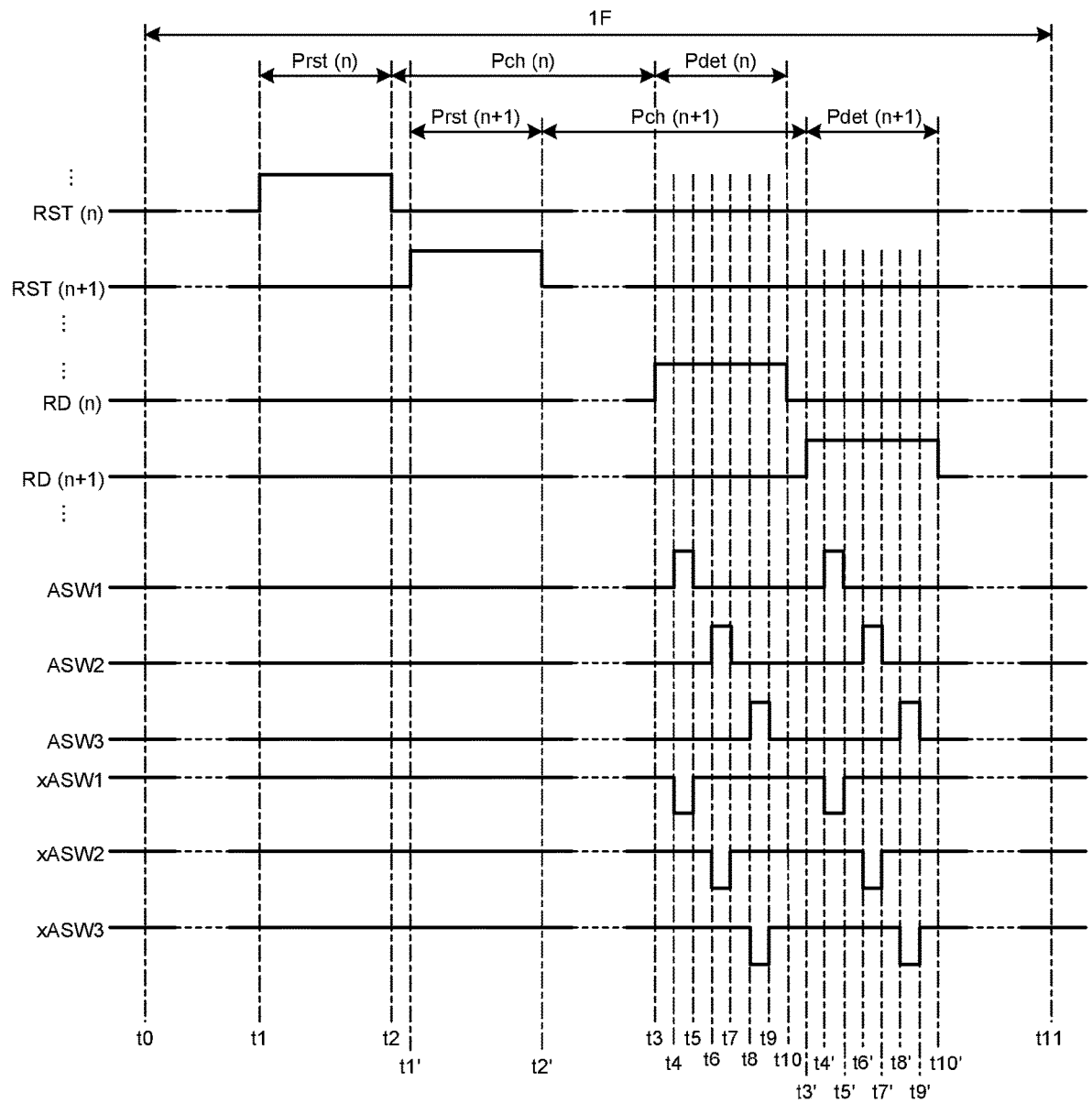
FIG. 5 is a timing waveform diagram illustrating an operation example of the detection device according to the first embodiment.

FIG. 5 is a timing waveform diagram illustrating an operation example of the detection device according to the first embodiment. As illustrated in FIG. 5, the detection element 3 performs the detection in the order of a reset period Prst, the storage period Pch, and a read period Pdet during a one-frame period 1F ranging from time t0 to time tn. The power supply circuit 103 supplies the reference potential VCOM to the anode of the photoelectric conversion element 30 over the reset period Prst, the storage period Pch, and the read period Pdet. FIG. 5 illustrates the reset period Prst(n), the storage period Pch(n), and the read period Pdet(n) in the detection elements 3(*n, m*), 3(*n, m*+1), and 3(*n, m*+2) in the nth row, and the reset period Prst(n+1), the storage period Pch(n+1), and the read period Pdet(n+1) in the detection elements 3(*n*+1, m), 3(*n*+1*, m*+1), and 3(*n*+1*, m*+2) in the (n+1)th row.

At time t1, the control circuit 102 sets the reset control signal RST(n) supplied to the reset control scan line GLrst (n) to HIGH (high-level voltage). This operation starts the reset period Prst(n) in the detection elements 3(*n, m*), 3(*n, m*+1), and 3(*n, m*+2) in the nth row. During the reset period Prst(n), the reset transistor Mrst belonging to each of the detection elements 3(*n, m*), 3(*n, m*+1), and 3(*n, m*+2) is turned on (into the conduction state) based on the reset control signal RST(n). This operation increases the potential of the node N1 to the reset potential Vrst. At this time, since the read transistor Mrd is off (in a non-conduction state), the reset potential Vrst generated at the node N1 is not reflected to the source of the source follower transistor Msf.

At time t2, the control circuit 102 sets the reset control signal RST(n) to LOW (low-level voltage) to end the reset period Prst and start the storage period Pch in the detection elements 3(*n, m*), 3(*n, m*+1), and 3(*n, m*+2) in the nth row. In the storage period Pch, the reset transistor Mrst is turned off (into the non-conduction state).

At time t1', the control circuit 102 sets the reset control signal RST(n+1) supplied to the reset control scan line GLrst(n+1) to HIGH (high-level voltage). This operation starts the reset period Prst(n+1) in the detection elements 3(n+1, m), 3(n+1, m+1), and 3(n+1, m+2) in the (n+1)th row. During the reset period Prst(n+1), the reset transistor Mrst belonging to each of the detection elements 3(n+1, m), 3(n+1, m+1), and 3(n+1, m+2) is turned on (into the conduction state) based on the reset control signal RST(n+1). This operation increases the potential of the node N1 to the reset potential Vrst. At this time, since the read transistor Mrd is off (in the non-conduction state), the reset potential Vrst generated at the node N1 is not reflected to the source of the source follower transistor Msf.

At time t2', the control circuit 102 sets the reset control signal RST(n+1) to LOW (low-level voltage) to end the reset period Prst(n+1) and start the storage period Pch(n+1) in the detection elements 3(n+1, m), 3(n+1, m+1), and 3(n+1, m+2) in the (n+1)th row. In the storage period Pch(n+1), the reset transistor Mrst is turned off (into the non-conduction state).

The signal corresponding to the light irradiating the photoelectric conversion element 30 is stored during the storage period Pch, and thereby the potential of the node N1 decreases to (Vrst−Vphoto). Vphoto denotes a signal (voltage change amount) corresponding to the light irradiating the photoelectric conversion element 30.

The storage period Pch is sufficiently longer than the read period Pdet. Therefore, in the read period Pdet (*1), the length of a period until the detection signal Vdet is actually read out can be ignored.

At time t3, the control circuit 102 sets the read control signal RD(n) to HIGH (high-level voltage). This operation turns on the read transistor Mrd of each of the detection elements 3(n, m), 3(n, m+1), and 3(n, m+2) (into the conduction state) to end the storage period Pch(n) and start the read period Pdet(n).

FIGS. 6A, 6B, 6C, and 6D are diagrams illustrating state examples of the first signal line selection circuit and the second signal line selection circuit.

In the present embodiment, the control circuit 102 sets the first selection signals ASW1, ASW2, and ASW3 to LOW (low-level voltage "L") and the second selection signals xASW1, xASW2, and xASW3 to HIGH (high-level voltage "H") (refer to FIG. 6A) for a period until at least the reset period Prst(l) in the detection elements 3(l, m), 3(1, m+1), and 3(1, m+2) in the first row ends in the one-frame period 1F. Then, in the read period Pdet, the control circuit 102 inverts the control logic of the first selection signals ASW1, ASW2, and ASW3 and the second selection signals xASW1, xASW2, and xASW3.

Figure 6A:
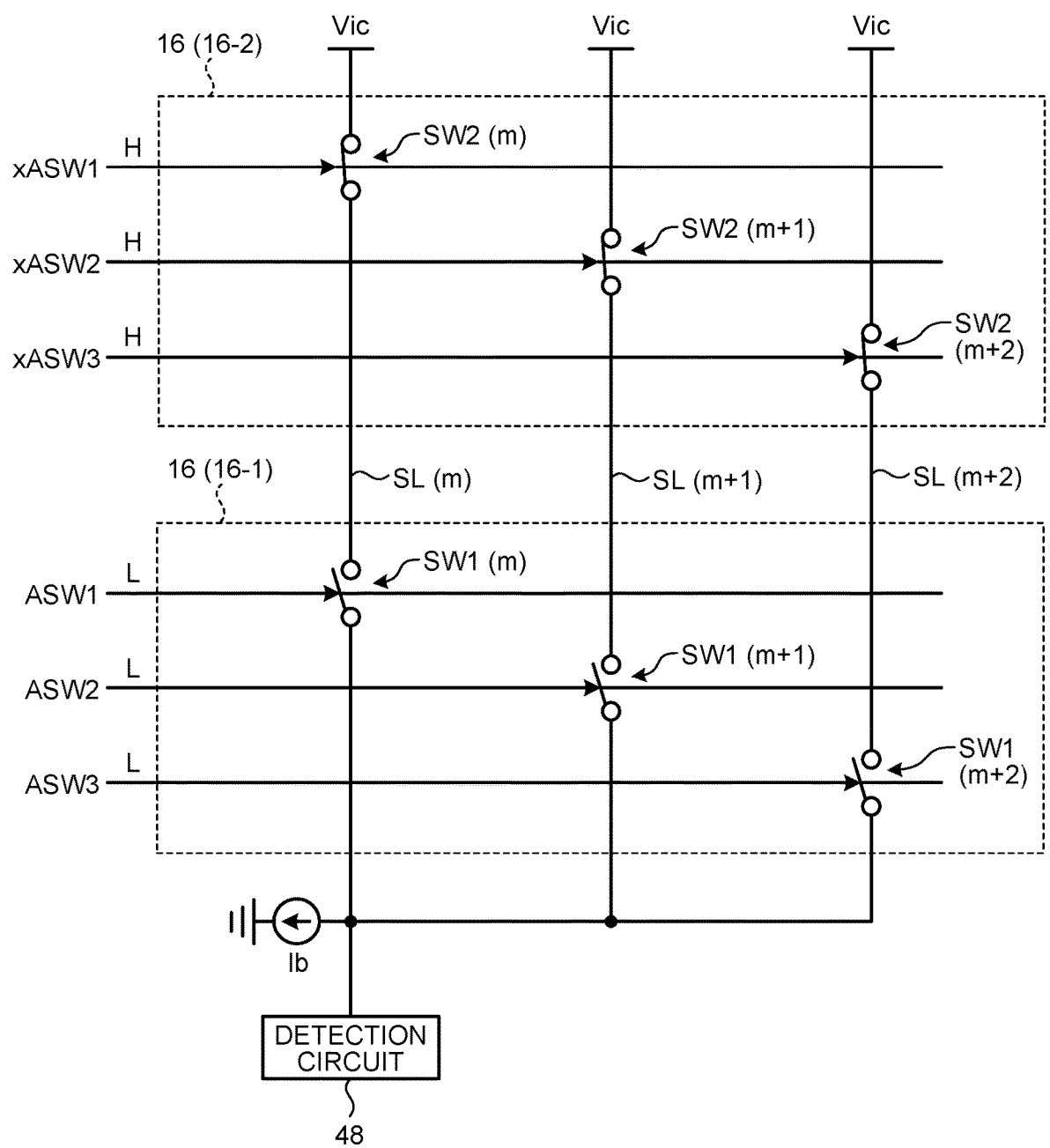
FIG. 6A is a diagram illustrating a state example of a first signal line selection circuit and a second signal line selection circuit.
Figure 6B:
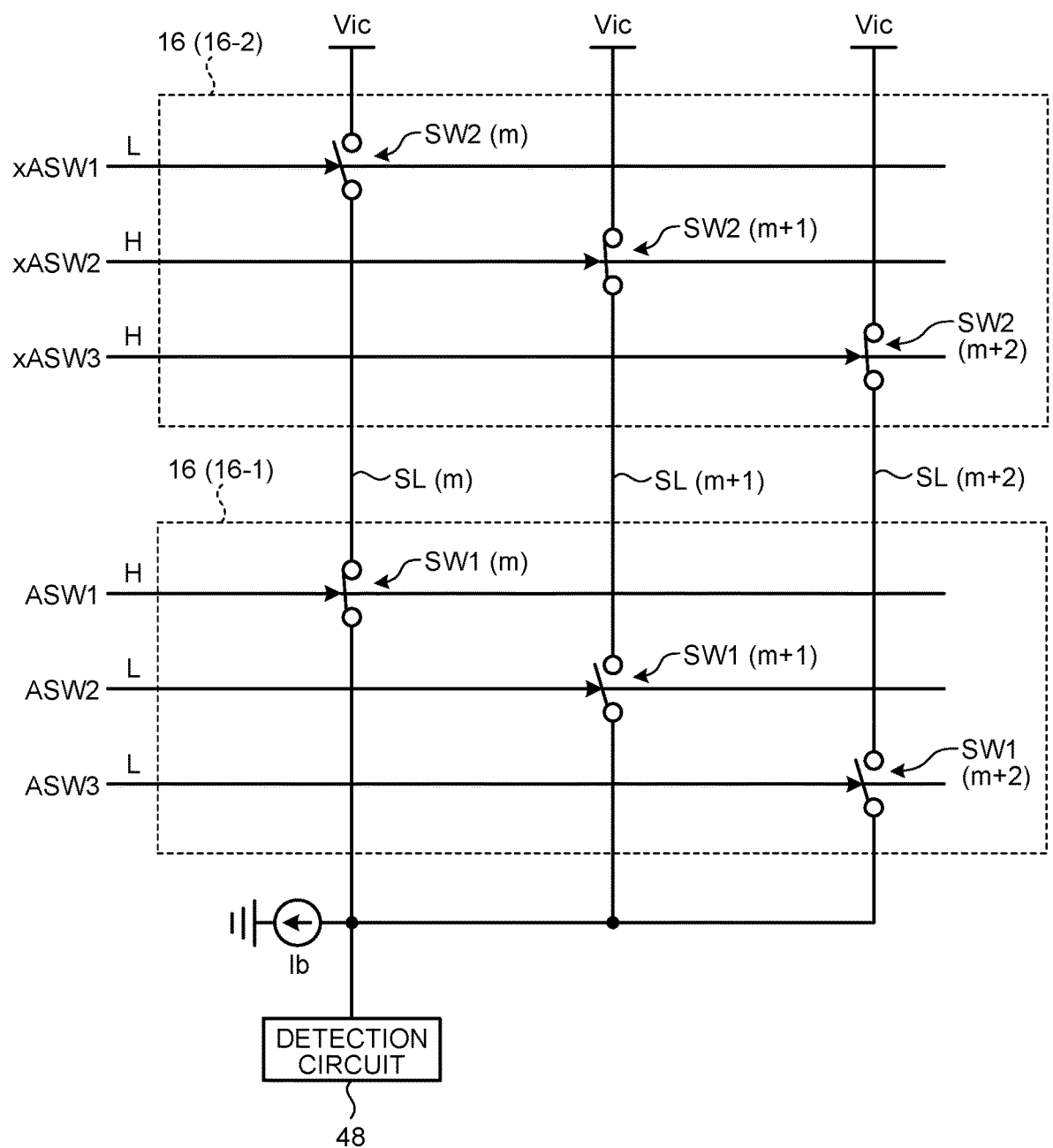
FIG. 6B is a diagram illustrating another state example of the first signal line selection circuit and the second signal line selection circuit.
Figure 6C:
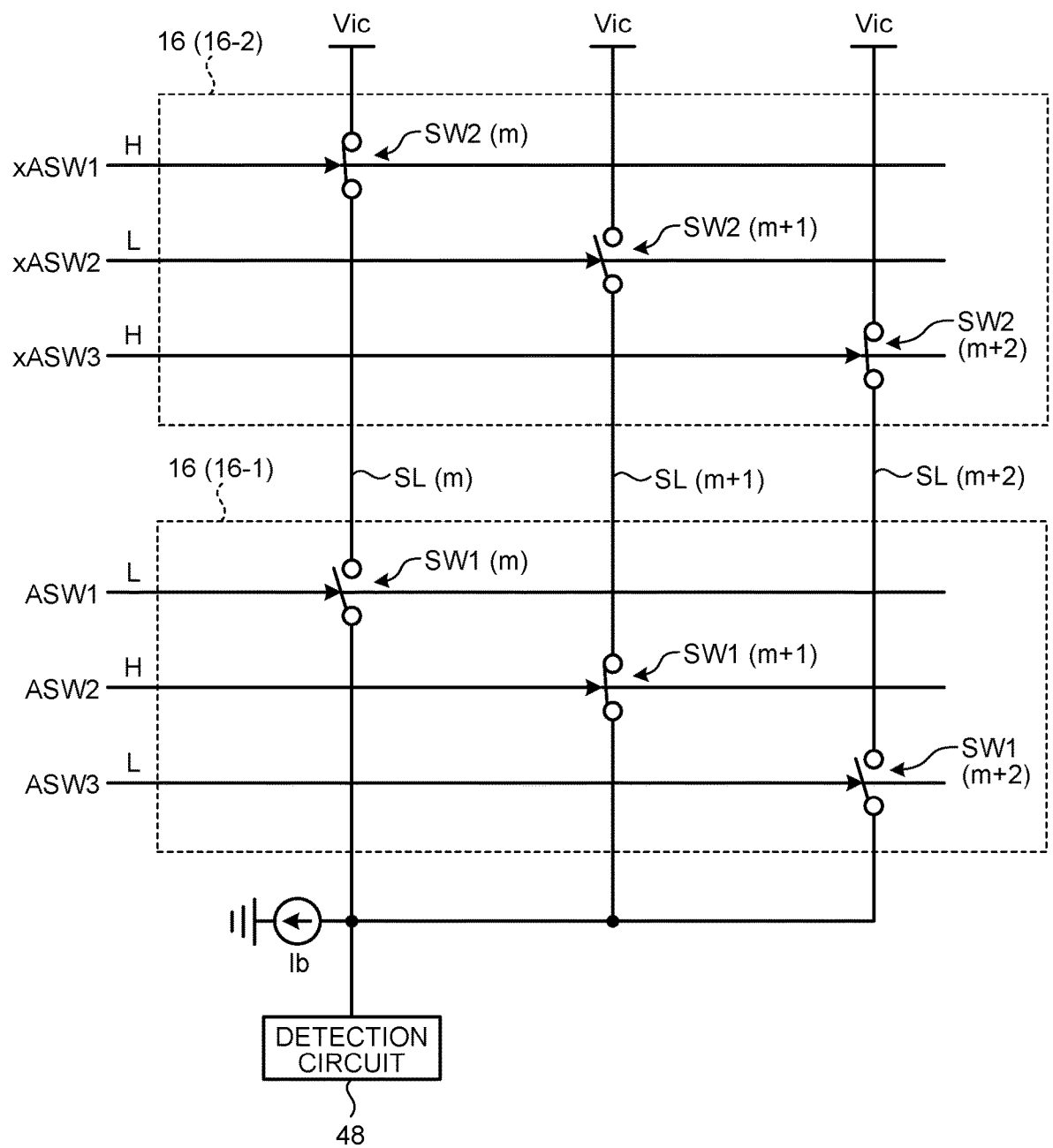
FIG. 6C is a diagram illustrating still another state example of the first signal line selection circuit and the second signal line selection circuit.
Figure 6D:
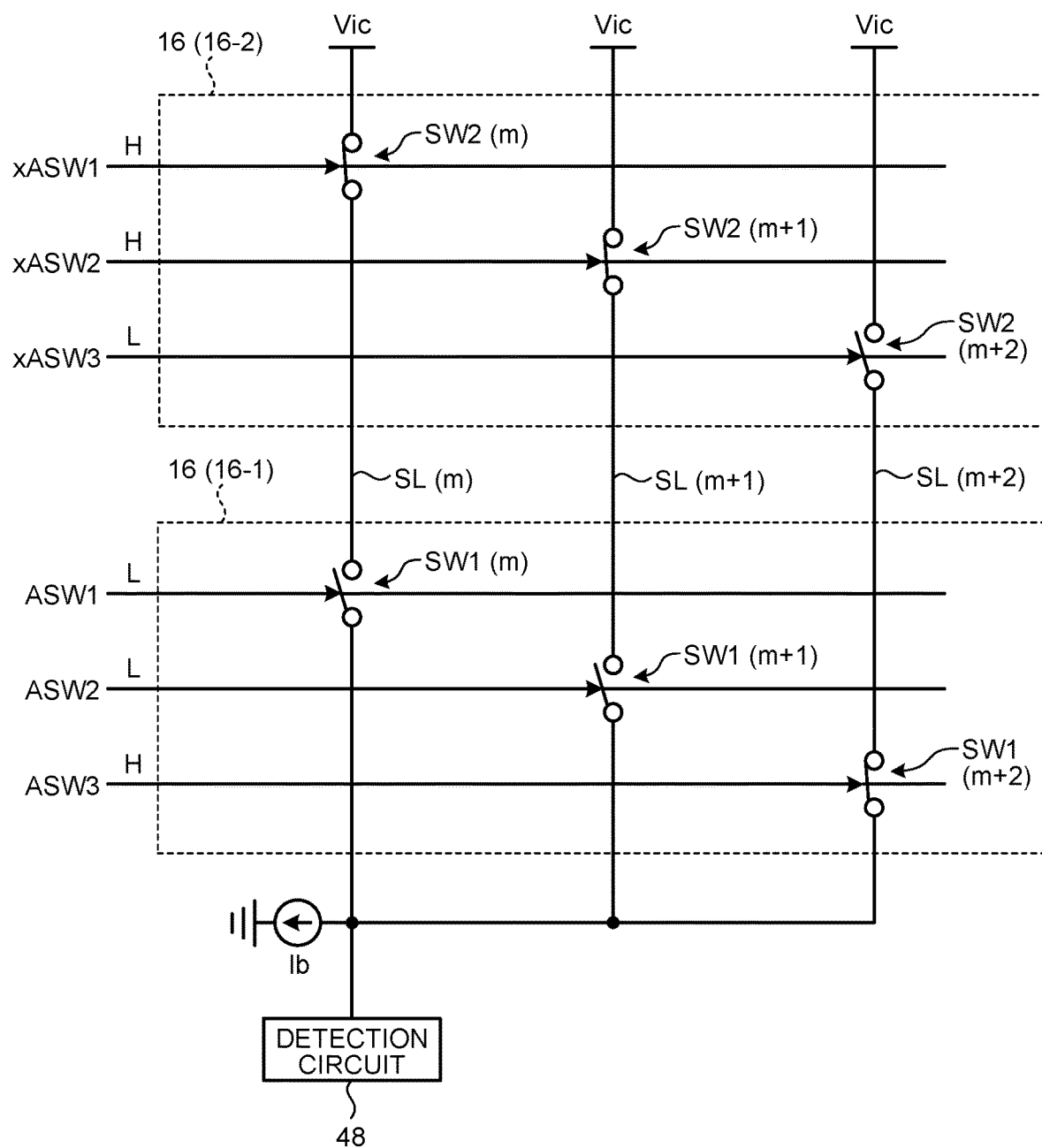
FIG. 6D is a diagram illustrating still another state example of the first signal line selection circuit and the second signal line selection circuit.

Specifically, in the read period Pdet, the control circuit 102 sets the second selection signal xASW1 to LOW (low-level voltage "L") in a period when the first selection signal ASW1 is set to HIGH (high-level voltage "H") (refer to FIG. 6B), sets the second selection signal xASW2 to LOW (low-level voltage "L") in a period when the first selection signal ASW2 is set to HIGH (high-level voltage "H") (refer to FIG. 6C), and sets the second selection signal xASW3 to LOW (low-level voltage "L") in a period when the first selection signal ASW3 is set to HIGH (high-level voltage "H") (refer to FIG. 6D). That is, the read period Pdet is temporally divided to detect the light irradiating the photoelectric conversion elements 30 belonging to the detection elements 3(n, m), 3(n, m+1), and 3(n, m+2) in the nth row. That is, the output line reference potential Vic is applied to each of the output signal lines SL during a period (precharge period) when the reading is not performed in each of the detection elements 3.

At this time, since the source follower transistor Msf and the read transistor Mrd are MOS transistors, the output line reference potential Vic substantially does not affect the potential of the node N1. As described above, if the source follower transistor Msf is an n-type transistor, the output line reference potential Vic is preferably set within the range from the potential of the node N1 assumed to be reached after the storage period Pch to the voltage lower than the potential by the gate-to-source voltage (Vth) of the source follower transistor Msf. Further, if the source follower transistor Msf is a p-type transistor, the output line reference potential Vic is preferably set within the range from the potential of the node N1 assumed to be reached after the storage period Pch to the voltage higher than the potential by the gate-to-source voltage (Vth) of the source follower transistor Msf. An assumed potential of the node N1 after the storage period Pch may be a previously determined potential at the time of design phase by averaging the values of the potentials of the respective nodes N1. The values of each of the potentials of the respective nodes N1 are determined by taking into account the tolerance in characteristic in between the predetermined detection elements 3. The tolerance in characteristic may affect to the variation in brightness.

The control circuit 102 sets the first selection signal ASW1 to HIGH (high-level voltage "H") for a period from time t4 to time t5 after the start of the read period Pdet(n). At this time, the control circuit 102 sets the second selection signal xASW1 to LOW (low-level voltage). As a result, the output signal line SL(m) is coupled to the detection circuit 48 through the first switching element SW1(m) (refer to FIG. 6B).

The control circuit 102 sets the first selection signal ASW2 to HIGH (high-level voltage "H") for a period from time t6 after time t5 to time t7. At this time, the control circuit 102 sets the second selection signal xASW2 to LOW (low-level voltage "L"). As a result, the output signal line SL(m+1) is coupled to the detection circuit 48 through the first switching element SW1(m+1) (refer to FIG. 6C).

The control circuit 102 sets the first selection signal ASW3 to HIGH (high-level voltage "H") for a period from time t8 after time t7 to time t9. At this time, the control circuit 102 sets the second selection signal xASW3 to LOW (low-level voltage "L"). As a result, the output signal line SL(m+2) is coupled to the detection circuit 48 through the first switching element SW1(m+2) (refer to FIG. 6D).

As a result, the detection circuit 48 can detect the light irradiating the photoelectric conversion elements 30 belonging to the detection elements 3(n, m), 3(n, m+1), and 3(n, m+2) in the nth row.

At time t10, the control circuit 102 sets the read control signal RD(n) to LOW (low-level voltage). This operation turns off the read transistor Mrd of each of the detection elements 3(n, m), 3(n, m+1), and 3(n, m+2) (into the non-conduction state) to end the read period Pdet(n).

Subsequently, at time t3', the control circuit 102 sets the read control signal RD(n+1) to HIGH (high-level voltage). This operation turns on the read transistor Mrd of each of the detection elements 3(n+1, m), 3(n+1, m+1), and 3(n+1, m+2) (into the conduction state) to end the storage period Pch(n+1) and start the read period Pdet(n+1).

The control circuit 102 sets the first selection signal ASW1 to HIGH (high-level voltage "H") for a period from time t4' to time t5' after the start of the read period Pdet(n+1). At this time, the control circuit 102 sets the second selection signal xASW1 to LOW (low-level voltage "L"). As a result, the output signal line SL(m) is coupled to the detection circuit 48 through the first switching element SW1(*m*) (refer to FIG. 6B).

The control circuit 102 sets the first selection signal ASW2 to HIGH (high-level voltage "H") for a period from time t6' after time t5' to time t7'. At this time, the control circuit 102 sets the second selection signal xASW2 to LOW (low-level voltage "L"). As a result, the output signal line SL(m+1) is coupled to the detection circuit 48 through the first switching element SW1(*m*+1) (refer to FIG. 6C).

The control circuit 102 sets the first selection signal ASW3 to HIGH (high-level voltage "H") for a period from time t8' after time t7' to time t9'. At this time, the control circuit 102 sets the second selection signal xASW3 to LOW (low-level voltage "L"). As a result, the output signal line SL(m+2) is coupled to the detection circuit 48 through the first switching element SW1(*m*+2) (refer to FIG. 6D).

As a result, the detection circuit 48 can detect the light irradiating the photoelectric conversion elements 30 belonging to the detection elements 3(*n*+1, m), 3(*n*+1, *m*+1), and 3(*n*+1, *m*+2) in the (n+1)th row.

At time t10', the control circuit 102 sets the read control signal RD(n+1) to LOW (low-level voltage). This operation turns off the read transistor Mrd of each of the detection elements 3(*n*+1, m), 3(*n*+1, *m*+1), and 3(*n*+1, *m*+2) (into the non-conduction state) to end the read period Pdet(n+1).

While FIG. 5 illustrates the operation example of the detection elements 3(*n*, *m*), 3(*n*, *m*+1), and 3(*n*, *m*+2) in the nth row and the detection elements 3(*n*+1, m), 3(*n*+1, *m*+1), and 3(*n*+1, *m*+2) in the (n+1)th row, the scan line drive circuit 15 can cause the detection elements 3 in the entire detection region AA to perform the detection by sequentially scanning the reset control scan lines GLrst and the read control scan lines GLrd in a time-division manner.

In the present embodiment, as described above, the read period Pdet is temporally divided to detect the light irradiating the photoelectric conversion elements 30 belonging to the detection elements 3(*n*, *m*), 3(*n*, *m*+1), and 3(*n*, *m*+2) in the nth row. At this time, in the read period Pdet, the control circuit 102 sets the second selection signal xASW1 to LOW (low-level voltage "L") in the period when the first selection signal ASW1 is set to HIGH (high-level voltage "H") (refer to FIG. 6B), sets the second selection signal xASW2 to LOW (low-level voltage "L") in the period when the first selection signal ASW2 is set to HIGH (high-level voltage "H") (refer to FIG. 6C), and sets the second selection signal xASW3 to LOW (low-level voltage "L") in the period when the first selection signal ASW3 is set to HIGH (high-level voltage "H") (refer to FIG. 6D). That is, except in the period when the light irradiating the photoelectric conversion element 30 of the detection element 3(*n*, *m*) is detected by setting the first selection signal ASW1 to HIGH (high-level voltage "H") and setting the second selection signal xASW3 to LOW (low-level voltage "L"), the output signal line SL(m) coupled to the read transistor Mrd of the detection element 3(*n*, *m*) is supplied with the output line reference potential Vic through the second switching element SW2(*m*).

This operation can discharge, for example, the electric charge of the output signal line SL(m) before the light irradiating the photoelectric conversion element 30 of the detection element 3(*n*+1, m) is detected after the light irradiating the photoelectric conversion element 30 of the detection element 3(*n*, *m*) is detected. Accordingly, the detection device 1 can reduce the variation in the detection signal Vdet caused by the detection result in the previous row, and thus, can improve the detection accuracy.

Figure 7:
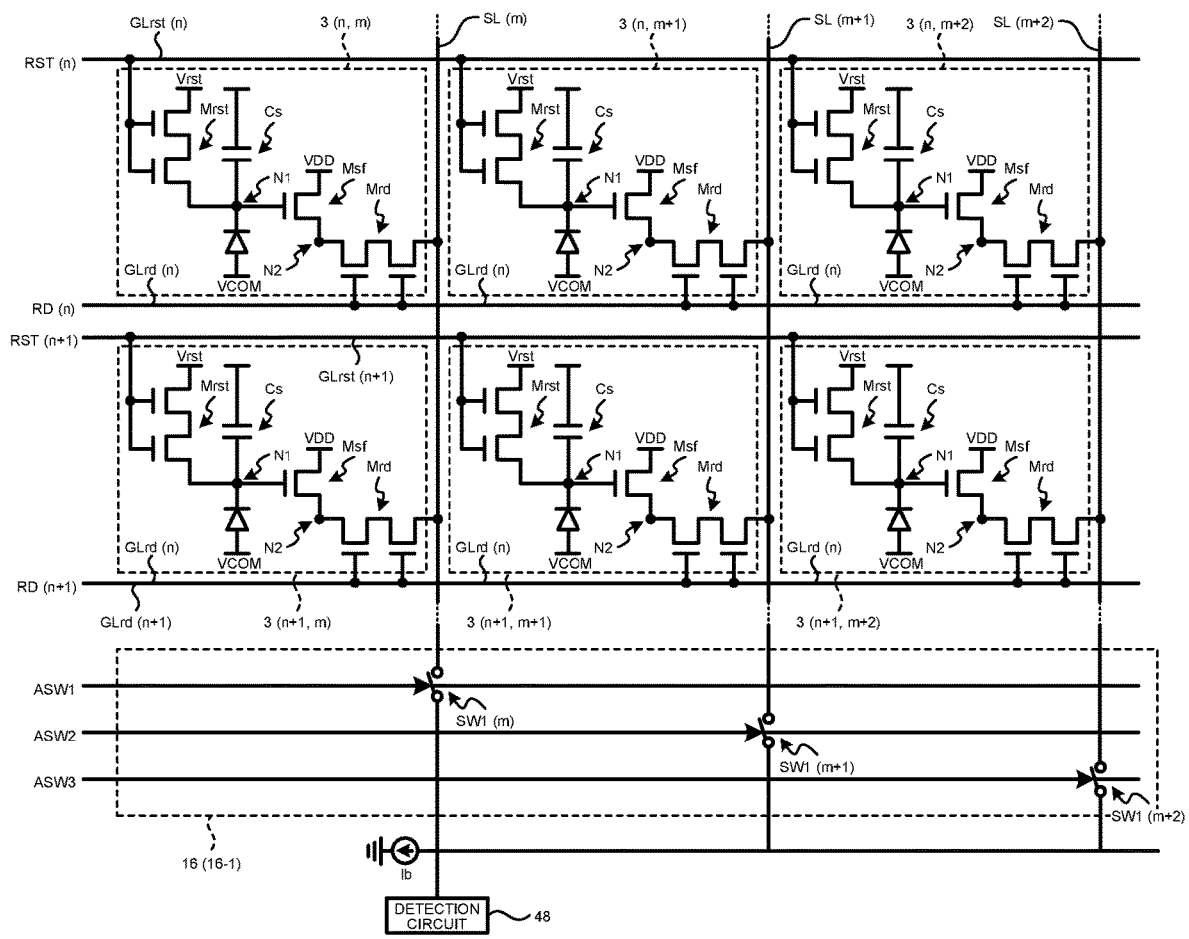
FIG. 7 is a circuit diagram illustrating an exemplary circuit configuration of a detection device according to a comparative example.
Figure 8A:
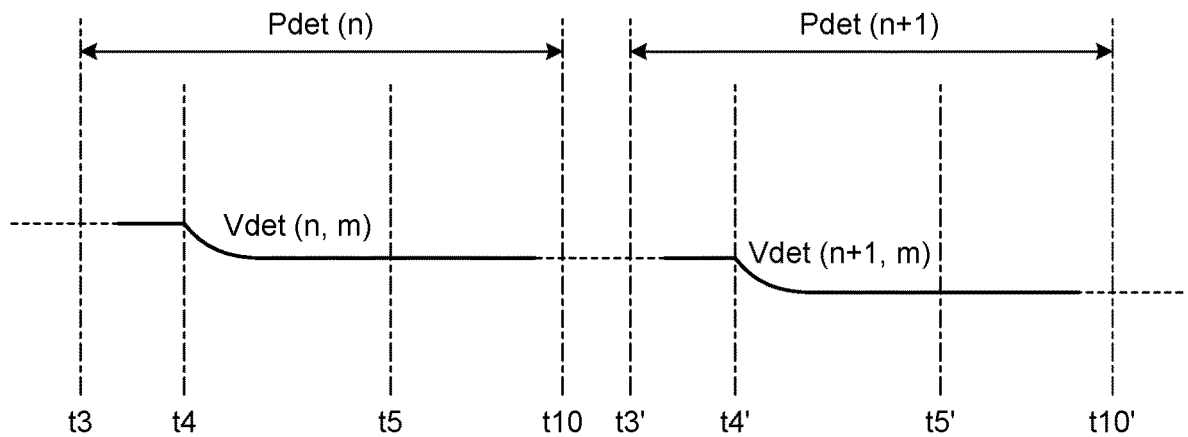
FIG. 8A is a diagram illustrating a change in potential of an output signal line according to the comparative example.
Figure 8B:
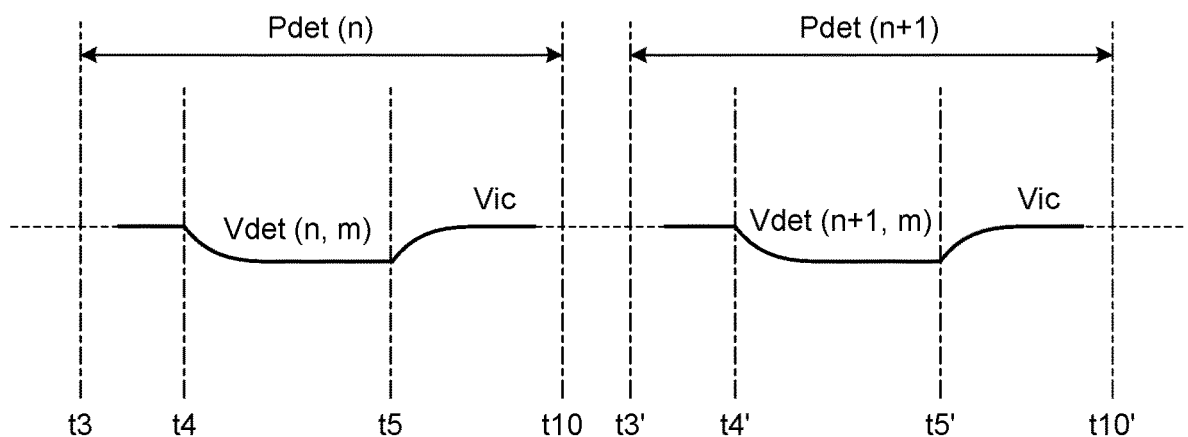
FIG. 8B is a diagram illustrating the change in potential of the output signal line according to the first embodiment.

FIG. 7 is a circuit diagram illustrating an exemplary circuit configuration of a detection device according to a comparative example. The comparative example illustrated in FIG. 7 illustrates a configuration without the second signal line selection circuit 16-2 illustrated in FIG. 4. FIG. 8A is a diagram illustrating a change in potential of the output signal line according to the comparative example. FIG. 8B is a diagram illustrating the change in potential of the output signal line according to the first embodiment. FIGS. 8A and 8B each illustrate the change in potential of the output signal line SL(m) during the read period Pdet(n) of the nth row and the read period Pdet(n+1) of the (n+1)th row illustrated in FIG. 5.

In the configuration of the comparative example illustrated in FIG. 7, as illustrated in FIG. 8A, the potential of the detection signal Vdet(n+1, m) of the detection element 3(*n*+1, m) detected in the period from time t4' to time t5' of the read period Pdet (n+1) of the (n+1)th row is affected by the detection signal Vdet(n, m) of the detection element 3(*n*, *m*) detected in the period from time t4 to time t5 of the read period Pdet(n) of the nth row, and thus, the detection accuracy may decrease. Specifically, for example, if the read period Pdet is negligibly shorter than the storage period Pch, the potential of the node N1 may be impossible to be reflected to the potential of the output signal line.

In contrast, in the present embodiment, as illustrated in FIG. 8B, the potential of the detection signal Vdet(n, m) of the detection element 3(*n*, *m*) detected in the period from time t4 to time t5 of the read period Pdet(n) of the nth row is precharged to the output line reference potential Vic at or after time t5. This operation can improve the detection accuracy of the detection signal Vdet(n+1, m) of the detection element 3(*n*+1, m) detected in the period from time t4' to time t5' of the read period Pdet(n+1) of the (n+1)th row.

As described above, if the source follower transistor Msf is an n-type transistor, the output line reference potential Vic is preferably set within the range from the potential of the node N1 assumed to be reached after the storage period Pch to the voltage lower than the potential by the gate-to-source voltage (Vth) of the source follower transistor Msf. Further, if the source follower transistor Msf is a p-type transistor, the output line reference potential Vic is preferably set within the range from the potential of the node N1 assumed to be reached after the storage period Pch to the voltage higher than the potential by the gate-to-source voltage (Vth) of the source follower transistor Msf. As described above, an assumed potential of the node N1 after the storage period Pch may be a previously determined potential at the time of design phase by averaging the values of the potentials of the respective nodes N1. The values of each of the potentials of the respective nodes N1 are determined by taking into account the tolerance in characteristic in between the predetermined detection elements 3. The tolerance in characteristic may affect to the variation in brightness. The above-described setting can reduce the time for stabilizing the detection signal Vdet, and can shorten the read period Pdet.

Second Embodiment

Figure 9:
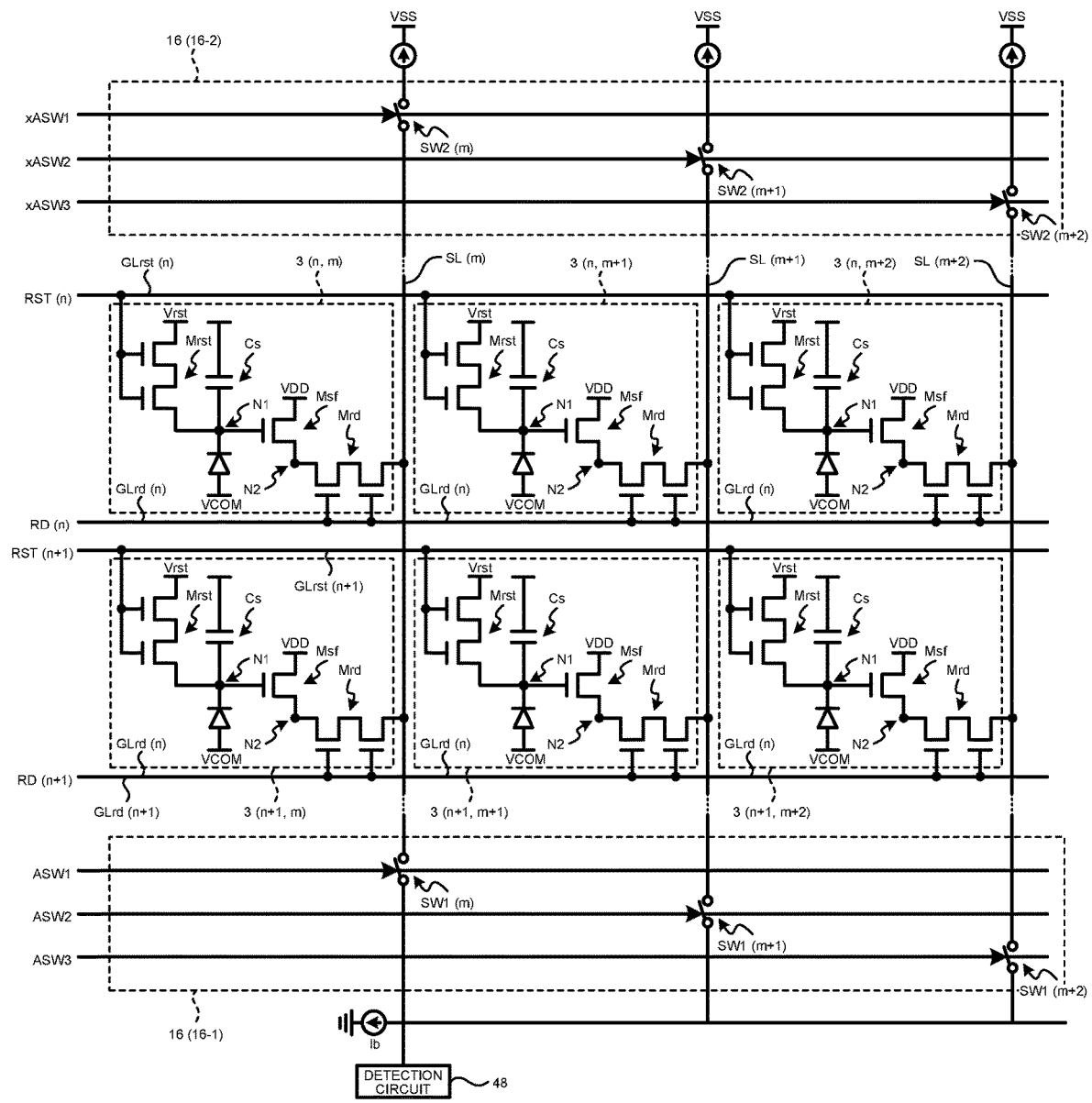
FIG. 9 is a circuit diagram illustrating an exemplary circuit configuration of the detection device according to a second embodiment of the present disclosure.

FIG. 9 is a circuit diagram illustrating an exemplary circuit configuration of the detection device according to a second embodiment of the present disclosure. In the following description, the same components as those described in the first embodiment above are denoted by the same reference numerals, and the description thereof will not be repeated.

In the present embodiment, the output signal line SL(m) is coupled to the current source circuit through the second switching element SW2(m). The output signal line SL(m+1) is coupled to the current source circuit through the second switching element SW2(m+1). The output signal line SL(m+2) is coupled to the current source circuit through the second switching element SW2(m+2).

In the present embodiment, a reference potential VSS is set to, for example, a ground (GND) potential. For example, in the present embodiment, if the source follower transistor Msf is an n-type transistor, the reference potential VSS is set to the GND potential. For example, if the source follower transistor Msf is a p-type transistor, the reference potential VSS is set to the power supply potential VDD. If the source follower transistor Msf is an n-type transistor, the reference potential VSS is preferably set within a range from the average value of the potentials of the respective nodes N1 obtained taking into account the tolerance in characteristic in between the predetermined detection elements 3 when the detection target is detected to a voltage lower than the average value by the gate-to-source voltage (Vth) of the source follower transistor Msf. Further, if the source follower transistor Msf is a p-type transistor, the reference potential VSS is preferably set within a range from the average value of the potentials of the respective nodes N1 obtained taking into account the tolerance in characteristic in between the predetermined detection elements 3 when the detection target is detected to a voltage higher than the average value by the gate-to-source voltage (Vth) of the source follower transistor Msf. The tolerance in characteristic may affect to the variation in brightness.

In the present embodiment, except in the period when the light irradiating the photoelectric conversion element 30 of the detection element 3(n, m) is detected by setting the first selection signal ASW1 to HIGH (high-level voltage "H") and setting the second selection signal xASW3 to LOW (low-level voltage "L"), the output signal line SL(m) coupled to the read transistor Mrd of the detection element 3(n, m) is coupled to the current source circuit through the second switching element SW2(m).

In the same manner as in the first embodiment, this operation can discharge, for example, the electric charge of the output signal line SL(m) before the light irradiating the photoelectric conversion element 30 of the detection element 3(n+1, m) is detected after the light irradiating the photoelectric conversion element 30 of the detection element 3(n, m) is detected.

Figure 10:
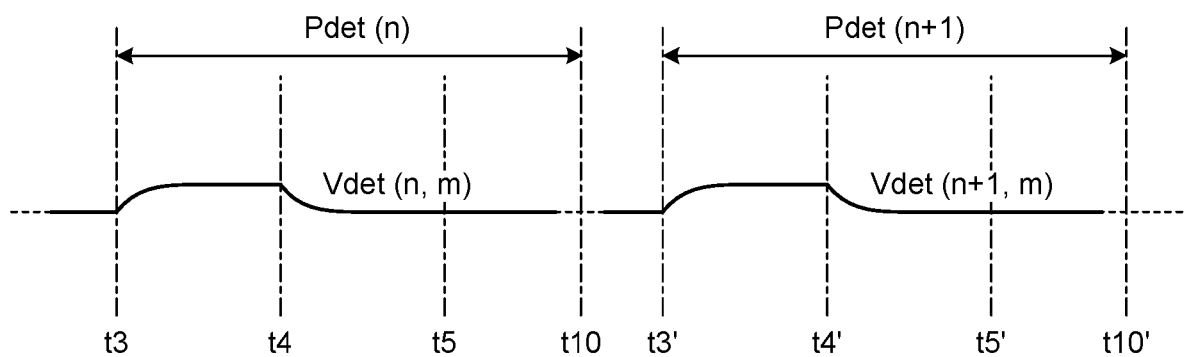
FIG. 10 is a diagram illustrating the change in potential of the output signal line according to the second embodiment.

FIG. 10 is a diagram illustrating the change in potential of the output signal line according to the second embodiment. FIG. 10 illustrates the change in potential of the output signal line SL(m) during the read period Pdet(n) of the nth row and the read period Pdet(n+1) of the (n+1)th row illustrated in FIG. 5.

In the present embodiment, as illustrated in FIG. 10, the potential of the detection signal Vdet(n, m) of the detection element 3(n, m) detected in the period from time t4 to time t5 of the read period Pdet(n) of the nth row is precharged by a bias current that flows to the read transistor Mrd of the detection element 3(n+1, m) at time t3' of the read period Pdet(n+1) of the (n+1)th row. This operation can improve the detection accuracy of the detection signal Vdet(n+1, m) of the detection element 3(n+1, m) detected in the period from time t4' to time t5'.

The bias current that flows to the read transistor Mrd is preferably equal to or close to the bias current Ib determined by the current source circuit on the detection circuit 48 side at the time of the detection. For example, if the bias current that flows to the read transistor Mrd during the precharge is too large, the gate-to-source voltage (Vth) of the source follower transistor Msf is made too large. Therefore, the bias current that flows to the read transistor Mrd during the precharge is set in advance to a value that causes the gate-to-source voltage (Vth) of the source follower transistor Msf to reach a value that allows the detection signal Vdet to be detected. The bias current that flows to the read transistor Mrd during the precharge differs in optimal value depending on whether the source follower transistor Msf is a p-type transistor or an n-type transistor, and therefore, is set as appropriate according to the circuit configuration.

In the present embodiment, for example, the potential of the output signal line SL(m) before the light irradiating the photoelectric conversion element 30 of the detection element 3(n+1, m) is detected after the light irradiating the photoelectric conversion element 30 of the detection element 3(n, m) is detected can be set to a value close to the potential of the detection signal Vdet(n+1, m) of the detection element 3(n+1, m). This setting can reduce the time for stabilizing the detection signal Vdet, and shorten the read period Pdet more than in the first embodiment.

Modification

Figure 11:
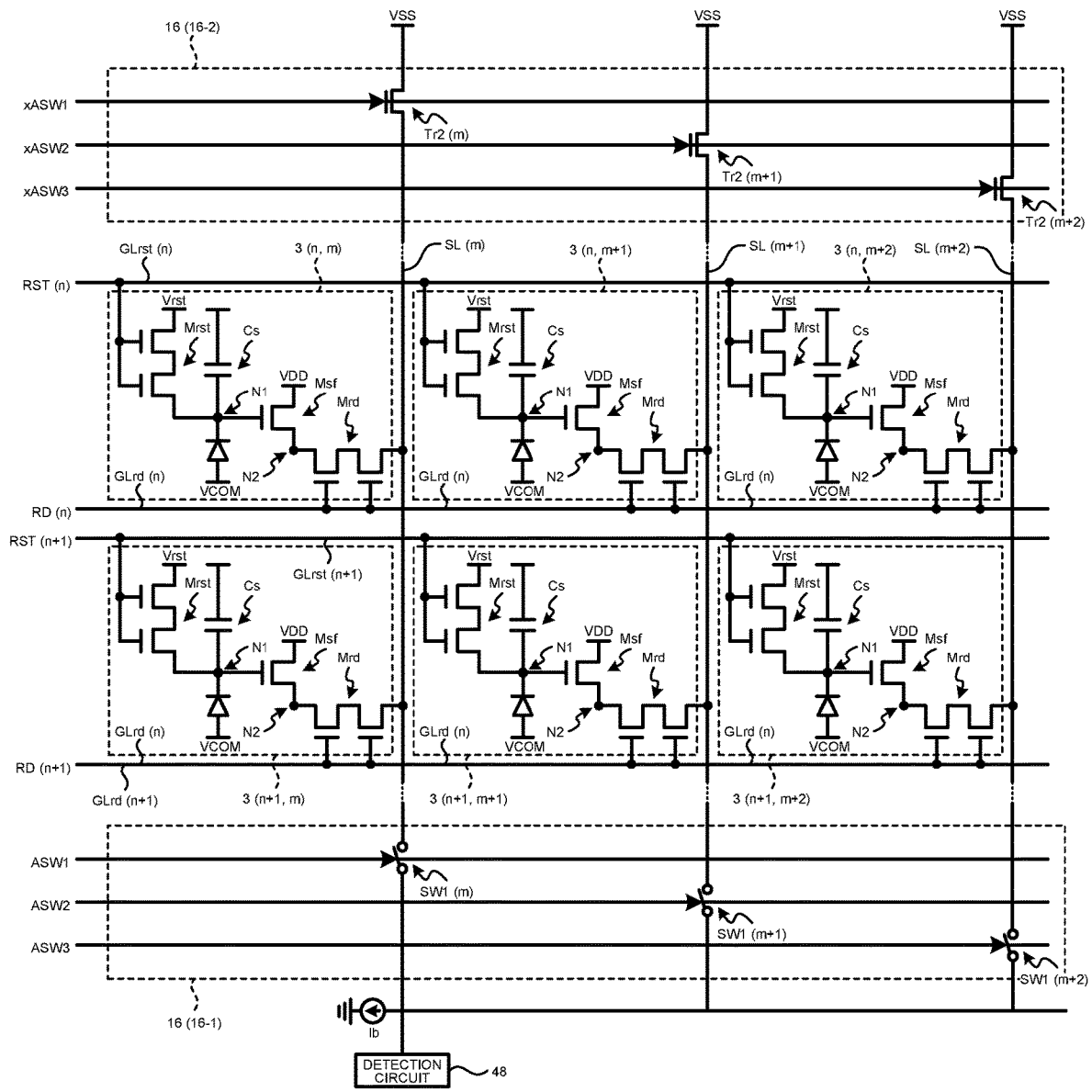
FIG. 11 is a circuit diagram illustrating an exemplary circuit configuration of the detection device according to a modification of the second embodiment.

FIG. 11 is a circuit diagram illustrating an exemplary circuit configuration of the detection device according to a modification of the second embodiment. The modification illustrated in FIG. 11 illustrates an example in which the current source circuit is not provided, and each of the second switching elements SW2(m), SW2(m+1), and SW2(m+2) illustrated in FIG. 10 is constituted by a TFT. FIG. 11 illustrates the second switching elements SW2(m), SW2(m+1), and SW2(m+2) illustrated in FIG. 10 as second switching elements Tr2(m), Tr2(m+1), and Tr2(m+2), respectively. The present modification has a configuration in which the bias current that flows to the read transistor Mrd during the precharge is set by a control amount (gate potential) of each of the second switching elements Tr2(m), Tr2(m+1), and Tr2(m+2).

In the modification illustrated in FIG. 11, the control circuit 102 controls the bias current to flow through the second switching element Tr2(m) to the output signal line SL(m) coupled to the read transistor Mrd of the detection element 3(n, m) during the precharge period except in the period when the light irradiating the photoelectric conversion element 30 of the detection element 3(n, m) is detected by setting the first selection signal ASW1 to HIGH (high-level voltage "H") and setting the second selection signal xASW3 to LOW (low-level voltage "L").

Also, in the present modification, as described above, the bias current that flows to the read transistor Mrd during the precharge is preferably equal to or close to the bias current Ib determined by the current source circuit on the detection circuit 48 side at the time of the detection. Specifically, for example, the bias current that flows to the read transistor Mrd during the precharge is set in advance to a value that causes the gate-to-source voltage (Vth) of the source follower transistor Msf to reach a value that allows the detection signal Vdet to be detected. The bias current that flows to the read transistor Mrd during the precharge differs in optimal value depending on whether the source follower transistor Msf is a p-type transistor or an n-type transistor, and therefore, is set as appropriate according to the circuit configuration.

For example, in an aspect of the present disclosure, the present modification is not limited to the configuration illustrated in FIG. 11 and a resistor R may be provided between the reference potential VSS and the second switching element Tr2(m) to determine the current that flows through the resistor R, that is, the bias current that flows to the read transistor Mrd, during the precharge.

With this configuration, in the same manner as the configuration illustrated in FIG. 9, for example, the potential of the output signal line SL(m) before the light irradiating the photoelectric conversion element 30 of the detection element 3(n+1, m) is detected after the light irradiating the photoelectric conversion element 30 of the detection element 3(n, m) is detected can be set to a value close to the potential of the detection signal Vdet(n+1, m) of the detection element 3(n+1, m). This setting can reduce the time for stabilizing the detection signal Vdet, and shorten the read period Pdet more than in the first embodiment.

The components in the embodiments described above can be combined with each other as appropriate. Other operational advantages accruing from the aspects described in the embodiments herein that are obvious from the description herein or that are appropriately conceivable by those skilled in the art will naturally be understood as accruing from the present disclosure.

What is claimed is:

1. A detection device comprising:
a plurality of detection elements arranged in a matrix having a row-column configuration in a detection region;
a plurality of scan lines coupled to the detection elements arranged in a first direction;
a plurality of output signal lines that are coupled to the detection elements arranged in a second direction different from the first direction, and to which the detection elements output detection signals;
a detection circuit configured to be supplied with the detection signals through the output signal lines;
a control circuit configured to output at least selection signals for switching between selection and non-selection of the output signal lines to supply the detection signals to the detection circuit;
a first signal line selection circuit configured to switch between the selection and the non-selection of the output signal lines to supply the detection signals to the detection circuit; and
a second signal line selection circuit configured to discharge an electric charge of each of the non-selected output signal lines different from the selected output signal lines, wherein
the control circuit is configured to control the second signal line selection circuit so as to conduct a predetermined constant current through each of the non-selected output signal lines when discharging the electric charge of the non-selected output signal line.

2. The detection device according to claim 1, wherein the scan lines comprise:
a plurality of reset control scan lines configured to supply reset control signals for applying a reset potential to the detection elements arranged in the first direction; and
a plurality of read control scan lines configured to supply read control signals for reading the detection signals from the detection elements arranged in the first direction.

3. The detection device according to claim 2, wherein each of the detection elements comprises:
a photoelectric conversion element configured to store a signal corresponding to irradiating light;
a reset transistor configured to apply the reset potential to a cathode of the photoelectric conversion element;
a source follower transistor configured to output a signal corresponding to a potential generated in the photoelectric conversion element; and
a read transistor configured to read an output signal of the source follower transistor, and output the detection signal.

4. The detection device according to claim 3, wherein
a reset period to apply the reset potential to the cathode or an anode of the photoelectric conversion element,
a storage period to store the signal corresponding to the irradiating light in the photoelectric conversion element, and
a read period to output the detection signal are incorporated, and
the control circuit is configured to perform control so as to sequentially switch the selected output signal lines during the read period.

5. A detection device comprising:
detection elements arranged in a detection region;
a switch coupled to each of the detection elements;
a scan line that is coupled to the switch, and is configured to control opening and closing of the switch;
an output signal line coupled to the switch;
a detection circuit configured to be supplied with a detection signal from each of the detection elements through the output signal line; and
a first switching element coupled to the switch and the detection circuit;
a second switching element coupled to and disposed between the switch and a power supplying a predetermined reference potential, wherein
the detection circuit reads out the detection signal from the output signal line, in a read-out period in which each of the detection elements is electrically coupled to the output signal line by the switch and the first switching element is ON, and
the predetermined reference potential is applied to the output signal line through the second switching element, except during the read out period.

6. The detection device according to claim 5, wherein each of the detection elements comprises:
a photodetector; and
a metal-oxide semiconductor (MOS) transistor, and
a gate of the MOS transistor is coupled to the photodetector, and a source of the MOS transistor is coupled to the switch.

* * * * *